United States Patent [19]

Linsker

[11] Patent Number: 4,615,011

[45] Date of Patent: Sep. 30, 1986

[54] ITERATIVE METHOD FOR ESTABLISHING CONNECTIONS AND RESULTING PRODUCT

[75] Inventor: Ralph Linsker, Scarsdale, N.Y.

[73] Assignee: IBM, Yorktown Heights, N.Y.

[21] Appl. No.: 562,754

[22] Filed: Dec. 19, 1983

[51] Int. Cl.⁴ .............................................. G06F 7/00
[52] U.S. Cl. .................................. 364/491; 364/148; 364/468
[58] Field of Search ............... 364/300, 491, 488, 194, 364/148, 468

[56] References Cited

U.S. PATENT DOCUMENTS

| | | | |
|---|---|---|---|
| 3,603,771 | 9/1971 | Isett et al. | 364/491 |
| 3,653,071 | 3/1972 | Hill et al. | 364/300 |
| 3,653,072 | 3/1972 | Ballas et al. | 364/300 |
| 3,654,615 | 4/1972 | Freitag | 364/491 |
| 3,681,782 | 8/1972 | Scanlon | 364/300 |
| 4,093,990 | 6/1978 | Koller et al. | 364/520 |
| 4,495,559 | 1/1985 | Gelatt, Jr. et al. | 364/300 |

OTHER PUBLICATIONS

IBM Technical Disclosure Bulletin, vol. 25, No. 7B, Dec. 1982, pp. 3619–3628.
IBM Technical Disclosure Bulletin, vol. 26, No. 3A, Aug. 1983, pp. 934–936.
An Algorithm for Path Connections and Its Applications, by C. Y. Lee, Sep. 1961–IRE Transactions on Electronic Computers, pp. 316–318, 349–365.
The Lee Path Connection Algorithm by Frank Rubin, Transactions on Computers, vol. C–23, No. 9, Sep. 1974, pp. 907–915.
An Iterative Technique for Printed Wire Routing by Frank Rubin, (IBM), pp. 308–313.
An Efficient Variable-Cost Maze Router, by Robert K. Korn, (Sperry Univac), 1982, IEEE, Paper 27.3, pp. 425–431.
A Formal Basis for the Heuristic Determination of Minimum Cost Paths, by Peter E. Hart et al., IEEE Transactions of Systems Science—Jul. 1968, pp. 100–107.
Optimization by Simulated Annealing by S. Kirkpatrick et al, Science, May 13, 1983, vol. 220, pp. 671–680.
IBM Technical Disclosure Bulletin, vol. 22, No. 3, Aug. 1979—pp. 1048–1049.
IBM Technical Disclosure Bulletin, vol. 24, No. 1B, Jun. 1981—pp. 730–731.

*Primary Examiner*—Jerry Smith
*Assistant Examiner*—Allen MacDonald
*Attorney, Agent, or Firm*—Sughrue, Mion, Zinn, Macpeak & Seas

[57] ABSTRACT

A method for establishing connections by automatically routing a plurality of paths between individual components using initially simple connection path shapes. The method is used to create an interconnection package with better use of wiring space. Each connection, in turn, is removed if previously routed, rerouted and evaluated according to specified penalty costs to minimize undesirable routing characteristics. This method is particularly advantageous in providing automatic path routing in directionally uncommitted planes for wiring highly integrated electric circuits, or the like.

41 Claims, 16 Drawing Figures

PATH OF MORE COMPLEX SHAPE

FIG.1a

I-SHAPED PATHS

FIG.1b

L-SHAPED PATHS

FIG.1c

Z-SHAPED PATHS

FIG.1d

U-SHAPED PATHS

FIG.1e

PATH OF MORE COMPLEX SHAPE

ITERATIVE METHOD FOR ESTABLISHING CONNECTIONS AND RESULTING PRODUCT

BACKGROUND OF THE INVENTION

1. Field of the Invention

This invention relates to a method for automatic routing of the connections between components on an integrated circuit substrate or on an interconnection board. More particularly, the invention pertains to an automatic, iterative wire routing method for global and detailed wiring for chips and higher level packages that does not require the user to specify a preferred wiring direction in each wiring plane, and the product resulting from the practice of said method.

Electrical connection of individual components on large or very large scale integrated circuits and interconnection packages, is achieved using metallic paths between the end points (or pins) which are to be connected. The paths between pins generally can be represented as lying on a grid of links and nodes arranged in a Cartesian coordinate system, or x, y, z configuration. A path between two or more pins is referred to as a net. A path between ony two pins is usually referred to as a connection. In some instances, it is necessary to use multiple levels of wiring planes wherein a path or a portion of a path must connect with another portion of the path or with a pin on a different plane. This is accomplished by using a "via" which is an etched or drilled hole in the substrate allowing a conductive path to extend from one level to another. Among the components to be connected may be one or more components referred to as a "macro" which consists of large, sophisticated subcircuits. Macros may be so densely packed that there is no space for connections to pass through these areas on the substrate. This is referred to as a blockage. Other wire path complications may arise when one net crosses over another, or when it passes too close to another net in the same or different planes resulting in cross-talk problems. Notwithstanding these restrictions, it is necessary to make the required connections automatically on the integrated circuit in the most efficient manner possible resulting in the fewest number of connections remaining to be hand embedded.

2. Description of the Prior Art

The concept of iteratively assigning net connections in accordance with a penalty function described in terms of "costs", is shown in IBM Technical Disclosure Bulletin, Volume 25, No. 7B, December 1982, pages 3619 through 3628. In the method taught by this paper, individual wire paths are routed serially using an algorithm for generating wire paths according to user specified penalty costs correlated with wiring grid locations. The wire paths are generated iteratively, with progressively higher penalty costs such as those assigned to wire path crossovers and vias. A path having the minimum penalty function is sought. IBM Technical Disclosure Bulletin, Volume 26, No. 3A, August 1983, page 934, uses capacity and estimated wiring load to provide an estimate of wiring congestion on a grid, rather than to provide an explicit wiring pattern. In contrast with the techniques described in the above discussed papers, the present invention first randomly assigns a path using a preselected simple shape for each connection. Alternative path shapes for each connection are then evaluated according to a penalty function which is defined in terms of user-specified penalty costs. This permits extendability to greater multilevel complexity, more balanced wiring and the use of fewer and directionally uncommitted planes.

U.S. Pat. No. 3,653,071 issued on Mar. 28, 1972, to Hill et al entitled, "Process For Producing Circuit Artwork Utilizing a Data Processing Machine" and U.S. Pat. No. 3,653,072 also issued on Mar. 28, 1972, to Ballas et al also entitled, "Process for Producing Circuit Artwork Utilizing a Data Processing Machine" both teach a method of routing nets between terminal pins of individual elements using a numbered ordered maze. It takes into account input information such as cell pin identification (including X and Y coordinates) along with "from-to" information. Starting at a first pin located, a numbered ordered maze is constructed which identifies all node to node distances, until the net is completed. At that point, a black track routine is used to establish the shortest path within the maze back to the pin at which the maze started. The routing method makes three passes wherein a pass constitutes attempted routing of all nets or some lesser number specified by the user of the method. Rerouting of nets which have failed in one pass is attempted in subsequent passes. U.S. Pat. No. 3,603,771 issued on Sept. 7, 1971, to Isett entitled, "Input/Output Signal Point Assignment" pertains to a method of assigning wiring connections in order of descending length, i.e., it starts with the longest connection to be routed, than the next longest and so forth. This procedure is done first with respect to nodes within rows and then to nodes between rows.

U.S. Pat. No. 3,654,615 to Freitag entitled, "Element Placement System" pertains to a method of connecting circuit elements in accordance with a preselected wiring pattern, such as the well known Lee algorithm discussed hereinbelow.

A number of algorithms have been developed to find optimal routing of individual connections. C. Y. Lee, "An Algorithm for Path Connections and Its Applications", Vol. EC-10, IRE Transactions on Electronic Computers, pages 316 to 365 (September 1961), pertains to an algorithm for finding the shortest path between two points which avoids certain prescribed obstacles.

The Lee path connection algorithm is further developed by F. Rubin, "The Lee Path Connection Algorithm", IEEE Transactions on Computers, Vol. 23, No. 9, (September 1974) and (erratum) IEEE Transactions on Computers, p. 208, (February 1976). Rubin modifies the Lee algorithm by introducing codings for the pins to be connected which will allow the correct operation of the algorithm under the most general path cost function using the minimum number of states possible, i.e., six states per cell. In addition, Rubin teaches adding the distance to the goal to the path cost function to substantially reduce the time required to execute the Lee algorithm.

In another paper by F. Rubin, entitled "An Iterative Technique for Printed Wire Routing," 11th Design Automation Workshop, page 308 (1974), a Lee type algorithm mazerouter is used to find a lowest cost path according to a penalty function which contains path length, crossing and adjacency penalty costs with the purpose of reducing the number of connections remaining unrouted. Rubin states that without the adjacency penalty costs, his method "makes some fairly small improvement in the number of wires routed." The present invention differs in several respects from the teachings of Rubin. Within the context of the present invention, it has been discovered that a substantial reduction in the number of unrouted connections can be achieved using a crossing costs, but no adjacency cost, in the penalty function.

Furthermore, the present invention uses a penalty function with appropriate costs parameters to facilitate "wrong-way" or multidirectional wiring within a plane. In addition, the present invention uses an appropriate penalty function to accomplish a variety of design goals, rather than just to minimize the number of unrouted nets. These design goals include reduction of total wire length, reduction of via count, reduction of cross-talk noise, and satisfaction of minimum and maximum wire length constraints for particular connections. R. Korn, "An Efficient Variable-Cost Maze Router", Paper 27.3, 19th Design Automation Conference IEEE, pages 425 through 431 describes the result of wire path routing through using the Rubin strategy of adding the distance to goal to the path cost function given in the first of the Rubin papers above described. In addition, Korn modifies the wire route algorithm by introducing a cost function having a value which is dependent upon whether the path is proceeding toward or away from the target.

P. E. Hart et al, "A Formal Basis for the Heuristic Determination of Minimum Cost Paths", IEEE Transactions of Systems Science and Cybernetics, SS-4, No. 2, pages 100 through 107 (1968), describes how a heuristic approach can be combined with a mathematical approach in an algorithm for finding an optimal wire path between two points, i.e., one with a minimum cost.

S. Kirkpatrick, C. D. Gelatt, Jr., and M. P. Vecchi (Science 220, p. 2671, 5/13/83) describe a wiring method that is limited to 'L' and 'Z' wire shapes within a single layer, considers at each step of the routing procedure only one possible alternative wire path for each wire, evaluates a specific penalty function equal to the sum of the squares of the number of wires on each link of the grid, and replaces a path by its alternative depending on the value of the penalty functions and on the choice of a random number. The feature of randomness is required by their approach to avoid becoming locked into a poor wiring solution. The present invention differs in several respects, including the following: The present invention achieves near-optimal assignment of connections to levels (planes or plane pairs) of the interconnection package; a more general penalty function of greater utility is used; a large number of possible moves are considered for each connection at each pass, allowing a near-optimal solution to be reached without introducing a random element; an 'uphill' option is provided that differs from the 'Metropolis Monte-Carlo' method of the cited reference and provides greater facility for improving the wiring layout; and more general path types and routing methods are provided, providing the ability to do global and detailed wiring for problems of realistic and useful complexity.

SUMMARY OF THE INVENTION

It is an object of this invention to provide a fast and efficient iterative routing method, applicable to global or detailed routing, of connections having patterns comprising simple path shapes.

It is a further object of the present invention to provide such a method wherein each potential path for a connection is evaluated in the presence of all connections on the interconnection package, not only those connections which have been successfully routed, so that the evaluation is against a background of the other connections, including "illegally" routed connections.

It is another object of the present invention to provide such a method wherein each potential path is evaluated without favoring previously routed connections.

It is another object of the present invention to route connections according to a penalty function which takes into account cost terms for crossovers, blockages, vias, bends, and other user specified conditions wherein "illegally" routed nets are penalized, not prohibited. This results in increased flexibility in choosing how to correct such "illegally" routed nets. This permits a balanced, iterative routing and plane-assignment method that achieves near optimization of an arbitrary penalty function and avoids the problems associated with "greedy" sequential algorithms, in which the first connections to be routed are able to choose optimal paths at the expense of subsequently routed connections, and to the detriment of overall routing quality.

It is yet a further object of the present invention to provide such a method wherein all or substantially all wire paths of a specified shape complexity are evaluated, in turn, to minimize the penalty function for each connection. This substantially reduces the risk of becoming "stuck" at a relative minimum penalty function value that is significantly greater than the absolute minimum value available.

It is a yet further object of the present invention to provide a method which distributes connections among the levels constituting planes or plane-pairs of a multilevel integrated circuit package in a way that provides balanced assignment of connections among the several levels.

It is common practice to route wires on chips and integrated circuit packages using one or more "plane pairs", with one plane of a pair being reserved predominantly for connections running along the "x" direction, and the other for connections running in the orthogonal or "y" direction. The present invention is concerned with an iterative method for generating effective wire routings without the need of assigning any directional preference to planes or sectors of planes. Connection paths are laid out in both directions in all planes and the routing is optimized subject to user specified costs and constraints regarding cross-overs, blockages, load, capacitances, via count and locations, bends etc. The algorithms that permit this method to succeed, rather than leading to large numbers of pins with blocked escapes, are described.

The routing method described herein provides a very high level of design freedom that can be translated into a substantial reduction in the number of vias required to wire a given set of connections. For test cases, the number of vias has been reduced by a factor of up to five with an improvement in wireability and no change in total wire length.

The wiring method described herein has also been used to improve wireability in the presence of blockages. For example, if macro blockages on a chip occur primarily in one of the wiring planes, wiring may be preferentially routed to the other planes.

BRIEF DESCRIPTION OF THE DRAWINGS

A complete understanding of the present invention, the foregoing and other objects, features and advantages of the invention will be apparent and may be gained from the specification, claims and drawings which describe and illustrate a preferred embodiment. In the drawings:

DETAILED DESCRIPTION

Figure 1A:
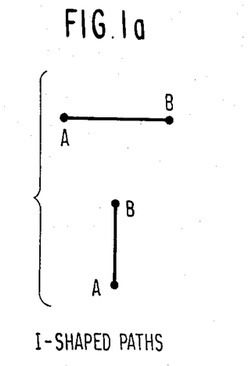
FIGS. 1(a)–(e) illustrate several connection path shapes. (As used herein I, L, Z and U shaped paths mean substantially I, L, Z and U shaped paths, that is, the shape though not a perfect I, L, Z and U configuration as illustrated in FIGS. 1a–1e strongly resembles such configuration.)

FIGS. 1(a) through (e) shows a plurality of simple connection path shapes employed by the present invention. Specifically, FIG. 1(a) is a straight or "I-shaped" path in two orientations. This path is characterized in that it has zero bends. In certain applications such as wiring integrated circuit boards an I-shaped path is the most preferred connection since manufacturing defects can occur more frequently at path bends than in the straight portions of the path.

Figure 1B:
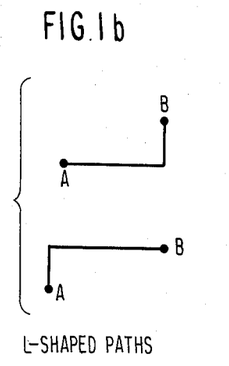

FIG. 1(b) shows an "L-shaped" path in two orientations connecting two endpoints. An L-shaped path is characterized in that it has a single path bend.

Figure 1C:
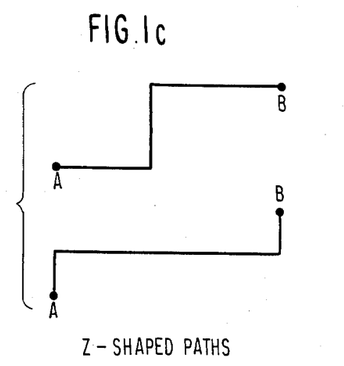

FIG. 1(c) illustrates a "Z-shaped" path in two orientations connecting the same two endpoints. A Z-shaped path is characterized in that it has two bends.

Figures 1D, 1E, 3:
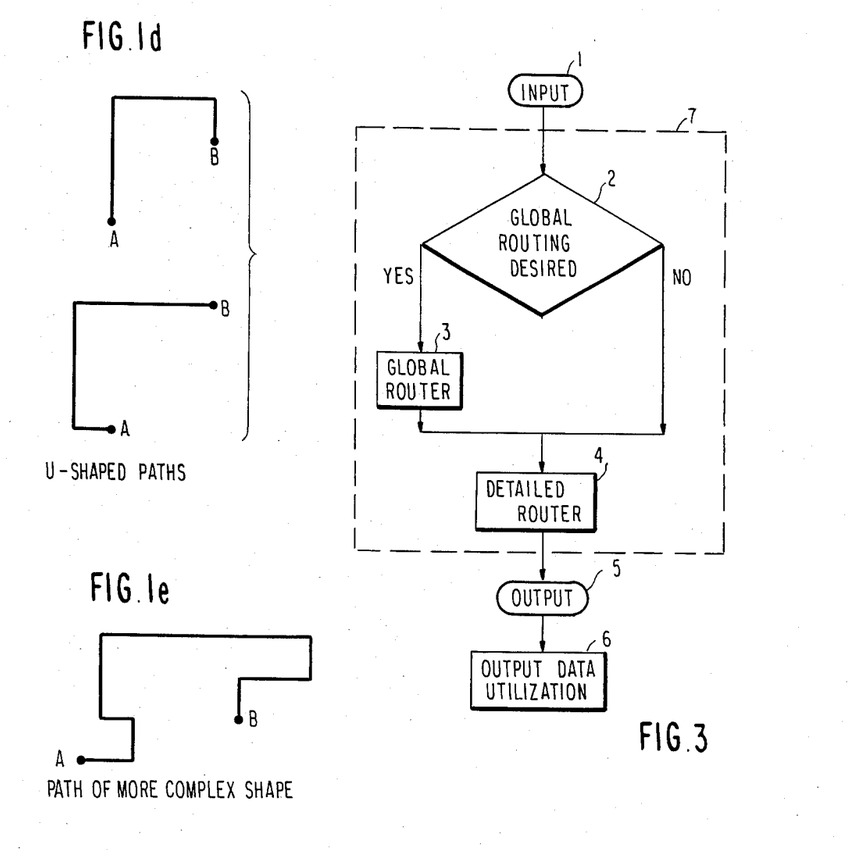
FIG. 3 depicts a generalized flow diagram representing the relationship of global routing and detailed routing methods in accordance with the present invention.

FIG. 1(d) illustrates a "U-shaped" path in two orientations connecting the same two endpoints. U-shaped paths are characterized by two bends and a detour. What is meant by detour is that the total length of a U-shaped path between two points will be longer than an L-shaped or Z-shaped path connecting the same two points.

FIG. 1(e) illustrates a connection between plus A and B made using a path of more complex shape than the shapes discussed hereinabove.

Figure 2A:
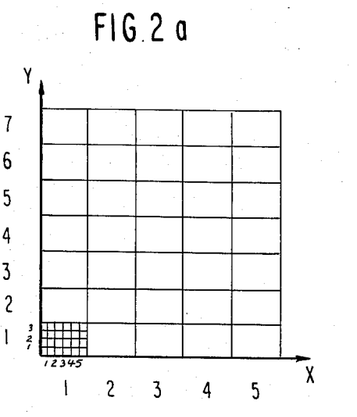
FIGS. 2(a)–(e) shows details of a grid structure and a connection on said grid.

Next with reference to FIGS. 2(a) through (e), the relationship of a connection with respect to a grid will be discussed. FIG. 2(a) shows generally a rectangular coarse grid, also referred to as a global grid, extending in the X and Y directions. This grid represents one of one or more layers, labelled by Z, of the global grid. (Generally speaking coordinates for global cells herein will be given as X, Y and Z and coordinates for detailed cells are given as x, y and z.) The X and Y axes intersect to form global cells such as (1,1); (2,1); (3,1) and so forth. Global cell (1,1) also shows the details of a fine grid made up of a plurality of grid lines in the x and y directions. (Each global cell usually contains a plurality of x and y grid lines). In practice, the actual connections are made using the fine grid.

Figure 2B:
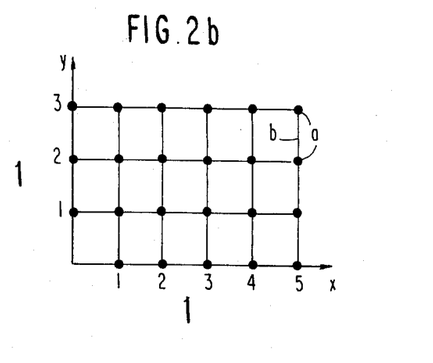

FIG. 2(b) shows details of the contents of global cell (1,1). Here it is clear that grid lines x1 to x5 intersect grid lines y1 to y3. The intersections of these grid lines shown at "a" are referred to as "nodes". Connecting segments shown at "b" between nodes are referred to as links.

For purposes of the present invention, "pin" is used to refer to a single node or a set of contiguous nodes that form an endpoint of a connection. A "connection" is simply a pair of pins that are to be connected using one or more links.

A "net" is a set of two or more pins that are to be connected wherein a two-pin net is a connection. Coordinates for a coarse cell or global cell are given in terms of X and Y while coordinates for a detailed cell are given in terms of x and y.

Figure 2C:
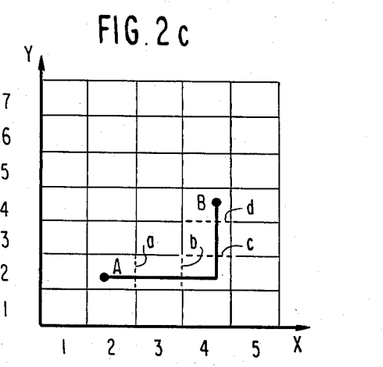

FIG. 2(c) shows a connection positioned within several global cells of a coarse grid. The connection begins at a pin A in global cell (2,2) crosses through edge "a" into global cell (3,2), crosses another edge "b" into global cell (4,2), makes a bend and crosses edge "c" of cell (4,1) and edge "d" of global edge (4,3) and terminates at pin B in global cell (4,4).

Figure 2D:
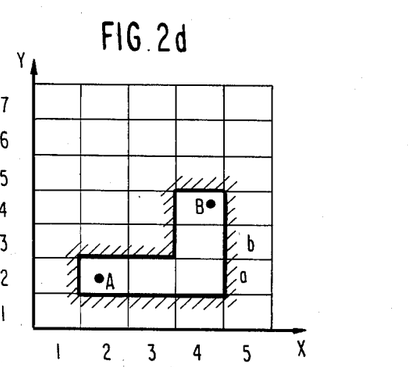

FIG. 2(d) outlines global cells (2,2); (3,2); (4,2); (4,3) and (4,4) which make up a swath shown at "a" surrounding the connection illustrated in FIG. 2(c). The perimeter of the swath is shown at "b". Note that if more than one layer is considered, the swath will be three dimensional.

Figure 2E:
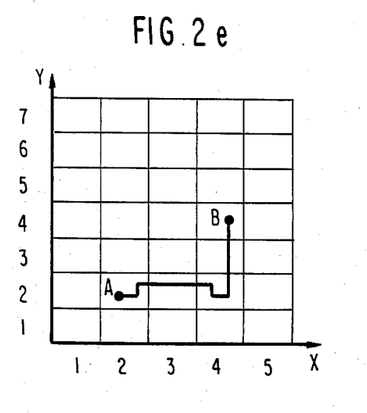

FIG. 2(e) shows a possible detailed path corresponding to the coarse or global path illustrated in FIG. 2(c).

In order to better understand the present invention, assume a rectangular wiring grid on which a set of connections are to be routed. Nets with more than two pins are assumed to have been decomposed into two-pin connections. (Note however, that neither the rectangular wiring grid assumption nor the two-pin configuration is essential to the method of the present invention.

The (x, y) coordinates of each pin and the plane in which each pin must lie, if this is prescribed by the connection list, are given for each connection. In addition, any grid nodes that are blocked in each plane z are identified by position, i.e., (x, y, z) coordinates. Similarly, the locations of available vias are also identified. Finally, any other ground rules such as position of components, macros, fixed path segments, vias, etc. appropriate to the particular technology are also given.

FIG. 3 shows a flow diagram of a routing method illustrating the relationship of global routing techniques, to detailed routing techniques in accordance with the present invention. As set forth above, the method according to the present invention requires certain information to be given or assumed and provided as input 1. This information relates to the list of (x, y, z) coordinates for the pins of each connection, board model specifications pertaining to positions and types of blockages, vias, wiring channels, and global cell coordinates, edge capacities (if the global router is being used) connection listings and in some cases as will be discussed job listings and a job priority list. The next step 2 is to choose whether to proceed with global routing at step 3 before proceeding to detailed routing at step 4, or bypassing global routing and going directly to detailed routing. The output of FIG. 3 will consist of route information, i.e., segment coordinates for each path. These segment coordinates can be provided to data utilization devices such as those controlling an interconnection package fabrication apparatus, an artwork generator and for other purposes such as manual rerouting of paths or portions of paths where needed. As the situation warrants, the method of the present invention may be practiced utilizing a digital data processing machine, illustrated schematically at 7.

Figure 4:
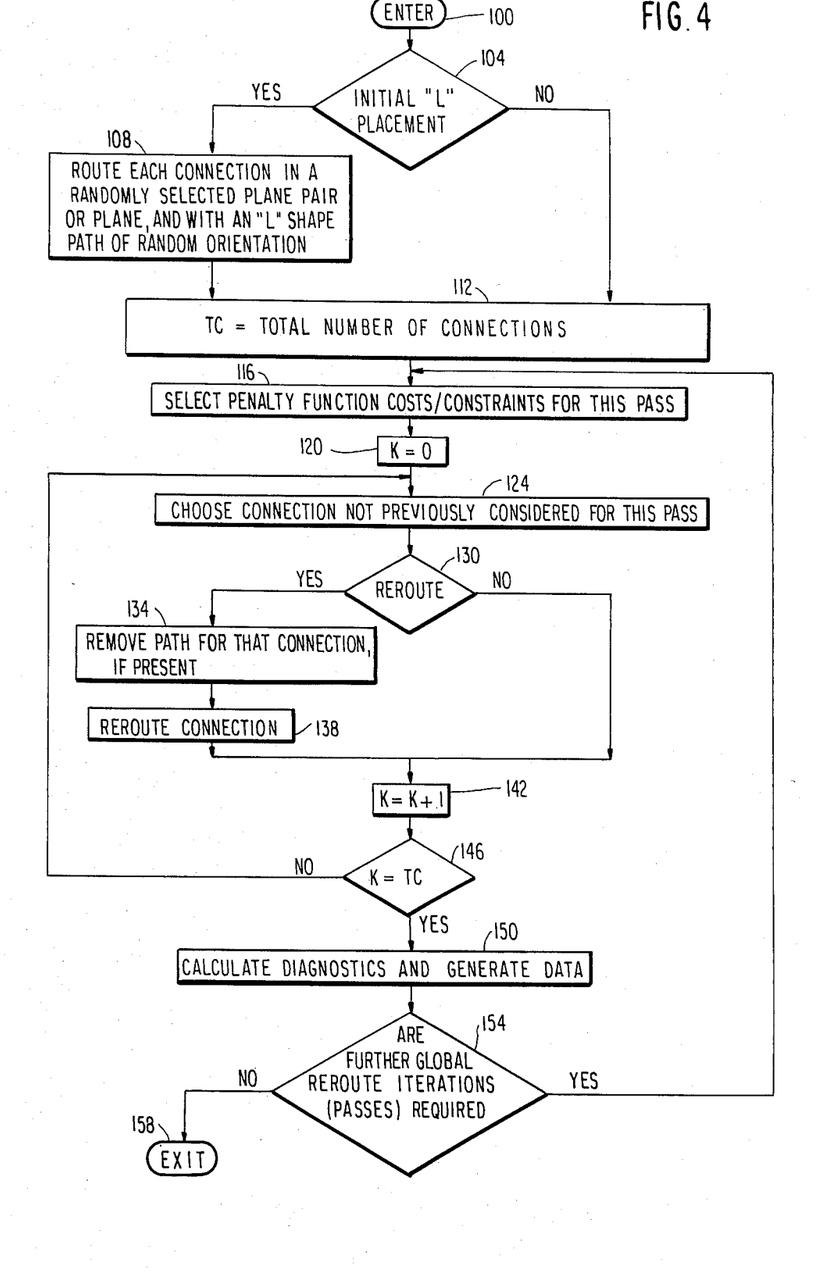
FIG. 4 shows a flow diagram of the global wire routing method.

FIG. 4 shows the details of the global routing method. The first step 100 is to enter information pertaining to the pin coordinates, board model specifications, global cell coordinates and edge capacities. Step 104 provides the option of starting with a specified simple path shape for the connections to be routed. If the option is elected the method proceeds to step 108, if not the method moves on to step 112. The purpose of this preparatory routing is to present the connection router with a reasonable background of wiring congestion against which each connection, in turn, will later be rerouted in an iterative fashion. At step 108 a simple wire path shape, such as an L-shaped path is chosen and the connection is oriented randomly and randomly assigned to a layer from among all the layers available. If the pins lie in the same row or column, initial routing is defined to be a straight line segment or an I-shaped path rather than the L-shaped path. At step 112, the total number of connections (TC) is specified. At step 116 costs are specified for the penalty function. The penalty function comprises costs (WX and WY) per cell traversed on the global grid which may vary among planes and/or regions within a plane, congestion costs (CONGi), threshold values (THRESHi) and bend costs (BEND). (If the "uphill" option is selected, as will be discussed later, it is also necessary to specify a "T" value.) At step 120, the value (K) of a counter is set to zero to ensure that each pass considers all connections to be rerouted.

Each iterative pass according to the present invention comprises the following further steps. At 124, a connection is selected arbitrarily from among the connections not yet selected on the present pass. At 130, a determination is made as to whether the particular connection selected is to be rerouted. If not, the method advances to step 142. If the connection is to be routed, the next step 134 is to remove the path for that connection if one already exists. The connection is rerouted at step 138 as will be explained in greater detail with reference to FIG. 5. Note that in the present method, every connection is always represented by a path on the global grid even if the path passes through overloaded global cell edges (edges through which more paths pass than are permitted by the board specification) or blocked regions (so-called "illegally" routed connections). Each connection is rerouted and reinserted in the grid before another connection is removed for rerouting. At step 142, the counter is increased by one unit indicating that one more connection has been selected in this pass. This number of connections selected is compared to the total number of connections to be routed (TC) at step 146 and if additional connections remain to be selected in this pass, it will be necessary to go back to step 124 and select another connection not yet selected during this pass. When the total number of connections considered during this pass (K) equals the total number of connections (TC), this pass is complete and the diagnostics of the grid, such as the number of global cell edges whose value of the ratio LOAD/CAPACITY lies between given bounds, is calculated and data corresponding to the connection path coordinates is generated at step 150. If further iterative global passes are required as determined at step 154, it will be necessary to go back to step 116 and a subsequent pass will begin. If no further passes are required, then the next step 158 is to exit from the global routing procedure.

Figure 5:
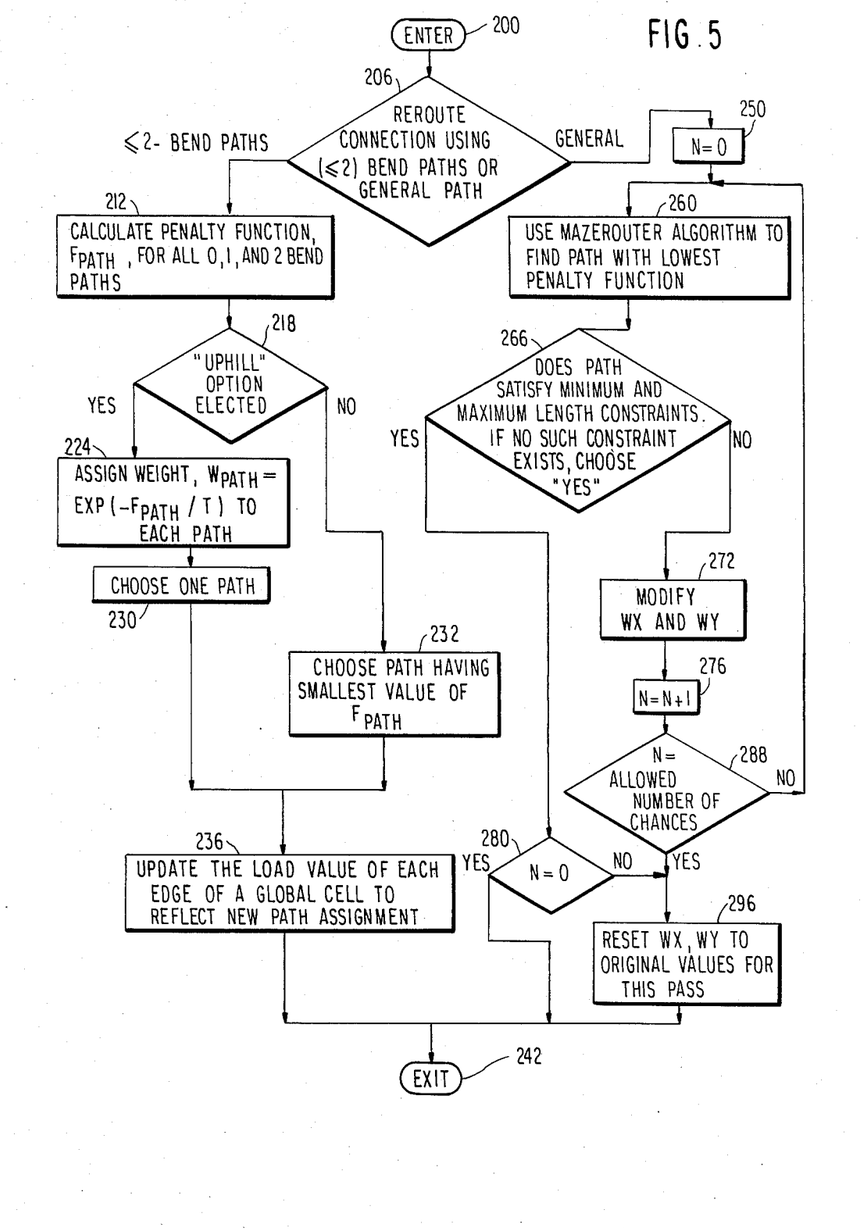
FIG. 5 shows a flow diagram depicting the reroute step of the global wire routing method illustrated in FIG. 4 in greater detail.

With reference to FIG. 5, the reroute step of the global routing, step 138 above, now will be considered in greater detail. The first step 200 is to enter the reroute procedure. This is done after step 134 has been completed. Reroute step 206 provides two user options, one for using a general path, another for rerouting using a path containing two or fewer bends. If the two or fewer bend path option is selected, the next step 212 is to calculate the penalty function, $F_{path}$ for all zero, one, and two bend paths for the connection then being considered. (All "U" shaped paths up to a specified maximum length are considered.) The penalty function may be defined as follows:

$F_{path} = \Sigma\{[WX \text{ or } WY] + [BEND, \text{ if the path changes direction at this global cell}] + [CONGi \times (LOAD - THRESHi \times CAPACITY), \text{ if } LOAD > (THRESHi \times CAPACITY)]\}$.

Here the sum runs over all global cell edges traversed by the path and CONGi is the congestion cost for each unit by which LOAD exceeds THRESHi × CAPACITY. CONGi and THRESHi refer to one or more pairs of values (for $i=1$ to imax, inclusive). The value "imax" is the number of different thresholds specified. LOAD is the number of connections, other than the one being routed, passing through a particular edge. CAPACITY equals the maximum number of connections allowed to pass through the edge as specified in the board model. THRESHi values are specified and are used to determine when the CONGi cost starts to be applied. WX or WY is chosen depending upon whether the edge is being traversed in the X or Y direction, respectively. With reference to FIG. 2(c) and in particular to that portion of connection AB crossing edges a, b and c, the following hypothetical case is provided for purposes of illustration: (for this case we assume imax=1.)

(1) At edge crossing "a"
Assume LOAD=2 (i.e. 2 other connections pass through that edge)
CAPACITY=6 (i.e., the board model specifies a maximum of 6 connections allowed through this edge)
THRESH1=0.5 (selected arbitrarily)
Then LOAD<THRESH1×CAPACITY, and the only contribution to $F_{path}$ from edge a is WX.

(2) At edge crossing "b"
Assume LOAD=3
CAPACITY=5
THRESH1=0.5, still.
Then LOAD—(THRESH1×CAPACITY)=3−(5×0.5)=0.5, which is greater than zero; therefore the contribution to $F_{path}$ from edge "b" is WX+CONGi×0.5.

(3) At edge crossing "c"
Assume LOAD and CAPACITY are the same as for edge "a". Since there is a bend in the cell, the contribution to $F_{path}$ from edge "c" is WY+BEND.

Figure 7:
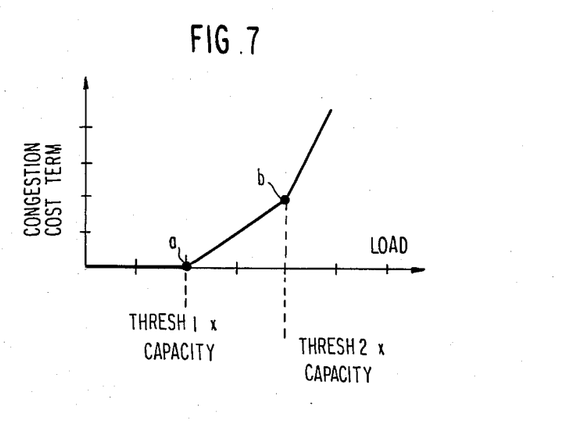
FIG. 7 shows a plot which illustrates one way in which a congestion cost term can vary as a function of load.

FIG. 7 illustrates how the congestion penalty term at an edge, $[CONGi \times (LOAD - THRESHi \times CAPACITY)]$, varies as a function of the value of LOAD at that edge. For this illustration we choose "imax" to equal two. Note that there is a congestion penalty of zero to the left of cusp (a), that is for LOAD less than THRESH1 times CAPACITY. For LOAD larger than this value, the congestion penalty increases at a uniform slope, equal to CONG1, until cusp (b) is reached at LOAD equals THRESH2 times CAPACITY. As LOAD is further increased, the congestion penalty increases at a steeper slope, equal to CONG1+CONG2.

At 218 after $F_{path}$ values have been calculated for each path, there is a choice of selecting the "uphill" option. By selecting this option, the method advances to step 224, and a path may be chosen that may not minimize and may even increase the value of $F_{path}$. This is effected by using the value of $F_{path}$ for each path considered in each layer for a given connection. A weight ($W_{path}$) is assigned to each path at step 224 such that: $W_{path} = \exp(-F_{path}/T)$ where the positive value T is specified for each pass. Next, a path is chosen at step 230 from among all paths considered, including the previously routed path for that connection, with the probability of choosing any particular path being proportional to $W_{path}$. Finally, at step 236, the value of LOAD at each edge of a global cell, reflecting the new path assignment, is updated and the reroute method is exited at 242.

Backing up to step 218, if the "uphill" option is not selected, step 232 requires choosing a path having the smallest value of $F_{path}$. The value of LOAD is updated at step 236 and the reroute method exited at 242 in a manner similar to that as if the "uphill" option were selected.

Going back further to step 206, if the general path option is selected, the next step 250 is to set the value (N) of a counter equal to zero. At step 260 a mazerouter algorithm, such as the Lee type discussed previously, finds a path at lowest cost, that is one having the smallest value of penalty function. At step 266, it is determined if the length of the path satisfies the minimum and maximum length constraints for this connection. If no such length constraint exists, or if such constraints are satisfied, the next step 280 is to determine the value of (N). If N=0 then the reroute method is exited at 242. If N does not equal zero then WX and WY must be reset to their original values for this pass. This is done at step 296 and the method then proceeds to exit at 242. Going back to step 266, if a maximum length constraint exists and is violated, however, length costs, WX and WY, are increased at step 272. If a minimum length constraint exists and is violated, length costs WX and WY are decreased at step 272. Note that WX and WY are not to be decreased below zero for the mazerouter to operate properly. At 276, a counter increases the value of (N) by one indicating that the path has had a chance to satisfy the WX and WY constraints. Step 288 determines if the number of chances has been exhausted. If not, then, it is necessary to return to step 260 to reexecute the mazerouter algorithm to find an alternative path which ultimately will satisfy the length constraints and result in going to exit step 242. If the number of chances has been exhausted as determined by step 288 then, the method proceeds to reset WX and WY as discussed before.

Figure 6A:
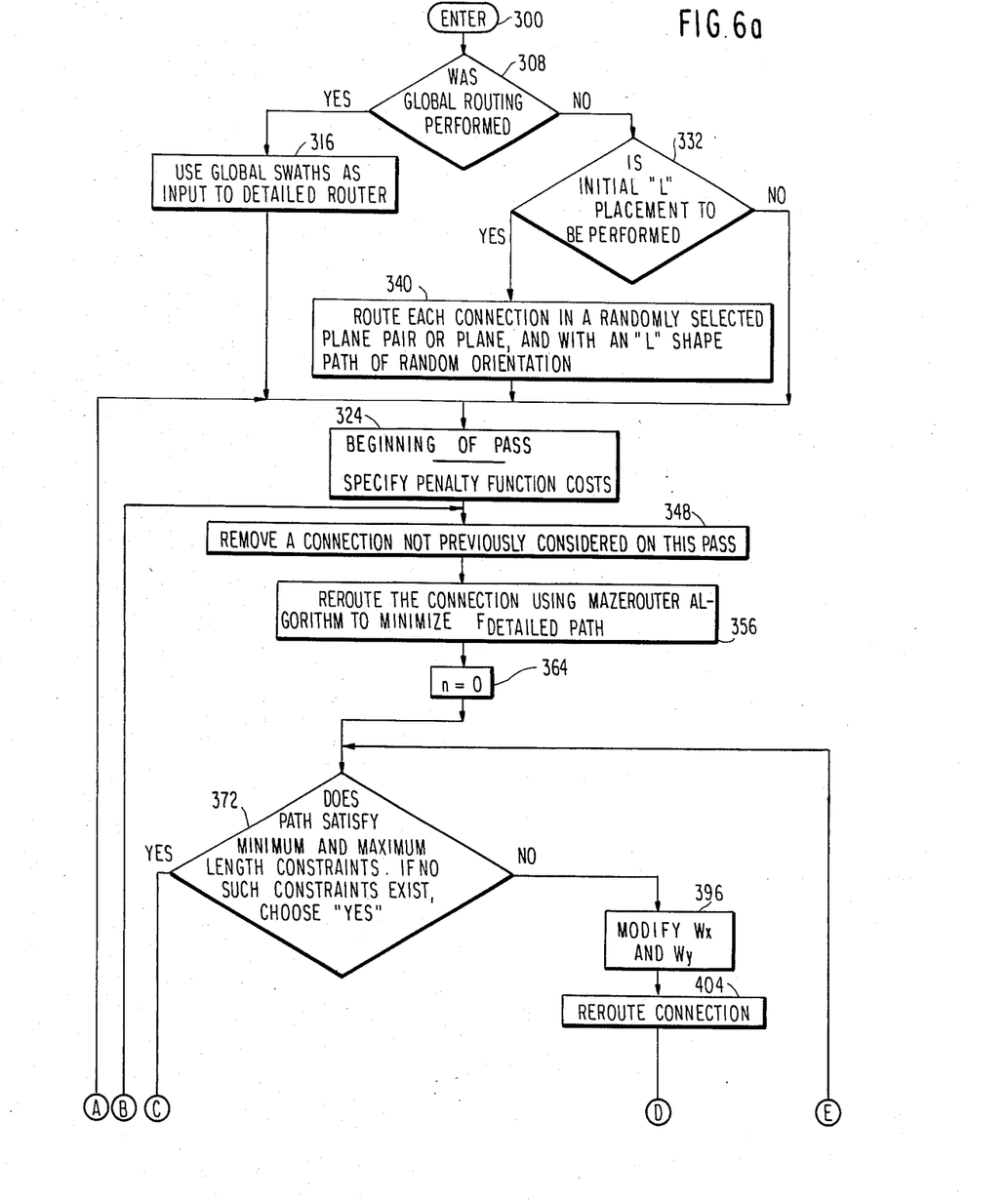
FIGS. 6(a) and (b) depict a flow diagram of the detailed routing method depicted as a single step in FIG. 3.
Figure 6B:
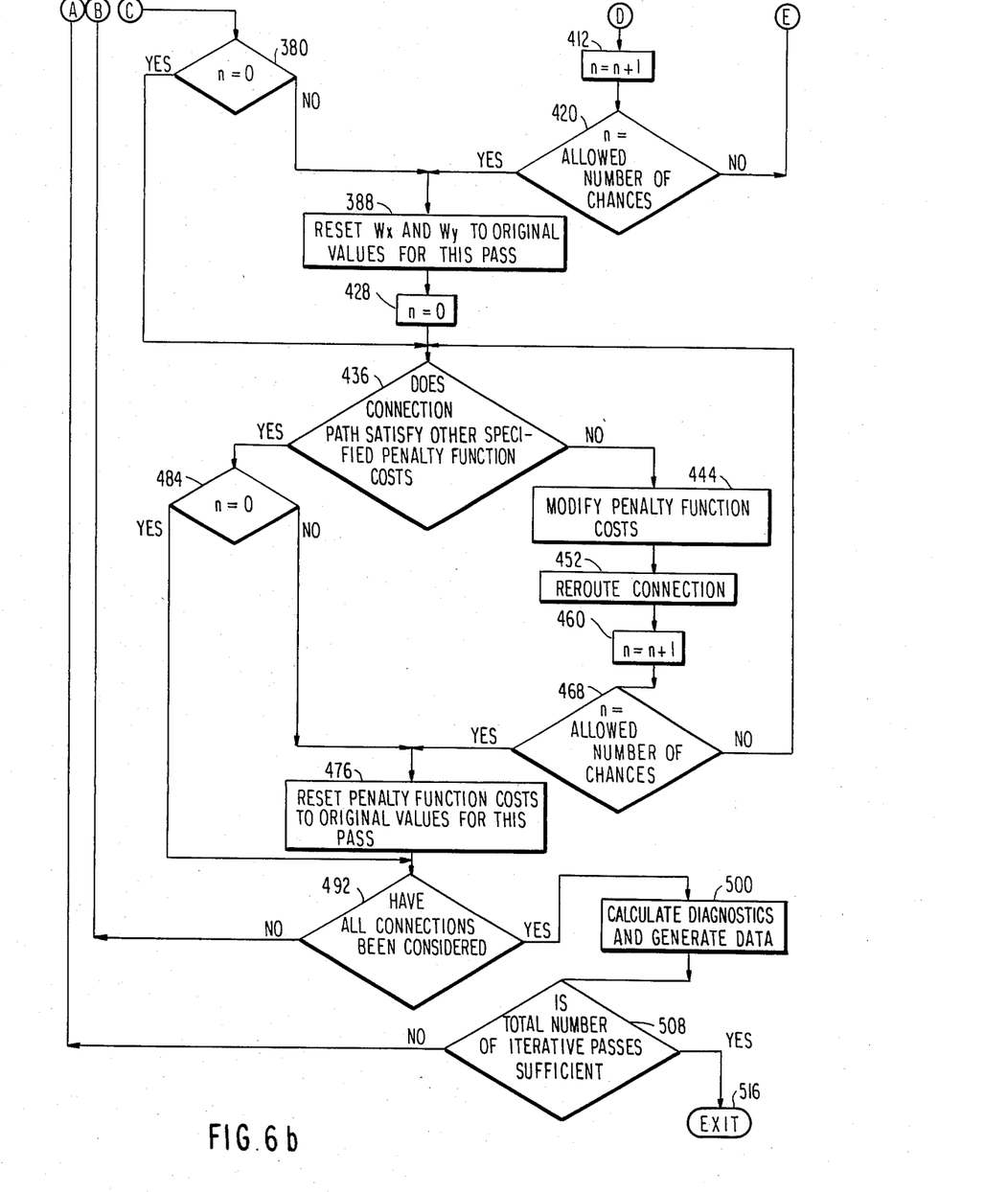

FIGS. 6a and 6b show a detailed router illustrated as a single step at 4 in FIG. 3. The program is entered at step 300 either directly from the general input or from the exit of the global router method as further illustrated in FIG. 3. At step 308, it is determined if global routing has been performed. If it has, step 316 uses the perimeters specifying global swaths developed by the global router as an additional input to the detailed router and begins a first pass at step 324. For each globally routed connection, the global swath is defined to be the set of global cells through which the global path passes. If no global routing has been performed as determined as step 308, then it is determined at step 332 if an initial "L" placement is to be performed. If so, then an initial L-shaped path placement is performed at step 340 in a manner and for the reasons set forth with respect to step 108 of the global router of FIG. 4. If an "L" path placement is not to be performed, then the method proceeds to step 324 and the pass begins. At step 324, a detailed path penalty function $F_{(detailed\ path)}$ is defined according to user specified penalty costs. In the embodiment illustrated, these include the following costs:

Costs (Wx and Wy) per link on the detailed grid which, as was discussed with respect to the global router, may vary from plane to plane and/or from region to region within a plane.

Node overload costs (OVER) for greater than or equal to a specified number of paths (or a path and a blockage) lying on a single node. For a printed circuit board, this specified number of paths is set at two, in order to penalize creation of a short circuit.

Via usage costs (VIA).

Via overload costs (VIAOVER) for two or moer paths using the same via.

A cost (BEND) for each bend existing in the path.

Adjacency costs (ADJAC) which are provided to control cross-talk noise and are assessed when a link parallel to and e.g., one grid unit away from, a path being routed, is already occupied by a wire path. Parallellism may be in the same plane or in adjacent planes.

A cost (REGION) for routing within specified regions within one or more planes.

A cost (BORDER) for each link of a path lying outside the perimeter of the global swath for that connection, if such perimeter has been specified.

At step 348, the path of one connection not previously considered in the present pass is removed. The next step 356 requires the connection to be rerouted to minimize $F_{(detailed\ path)}$. In this instance $F_{(detailed\ path)} = \Sigma\{[WX\ or\ WY]+[OVER]+[VIA]+[VIAOVER]+[BEND]+[ADJAC]+[REGION]+[BORDER]\}$, where the sum is over all nodes and links on the path.

In calculating $F_{(detailed\ path)}$ each cost term in the expression only contributes to the penalty function, if and only if, the condition corresponding to the cost exists at that node or link.

At step 364, a counter is set to zero to ensure that the number of attempts made to satisfy length constraints (see below) does not exceed a specified number. At the next step 372, it is determined if the path satisfies minimum and maximum length constraints, if any. If so, the method proceeds to step 380, where the value of (n) is checked. If (n) does not equal zero, that indicates that the penalty function costs have been modified as will be discussed below. Accordingly, it is necessary to set the penalty function costs to their original value which is done at step 388. If (n) equals zero, that indicates that the penalty function costs have not been modified, and the process may proceed to step 436. Going back to step 372 if these constraints are not satisfied, Wx and Wy are modified at step 396. If the path is violating a maximum length constraint, the Wx and Wy costs are increased at step 396. If the path is violating a minimum length constraint, the Wx and Wy costs are decreased at step 396. Note WX and WY are not to be decreased below zero, for the router to operate correctly. At step 404 the connection is rerouted using the modified parameters Wx and Wy. At step 412, a counter is advanced by one unit to change the value of (n) and at step 420 a determination is made as to whether the total allowed number of chances using the modified Wx and Wy costs has been reached. If the constraint is unsatisfied after the specified number of operations, the most recent routing is retained and the process proceeds at step 388 where Wx and Wy are reset to their original values. The counter is reset to zero at step 428.

If the only costs incurred for a particular lowest-cost path are Wx and Wy cost note that a minimum length constraint might not succeed in being satisfied on that iterative pass. In that case, there would be no other costs that could be reduced by lengthening the wire path on that iterative pass, even if Wx and Wy were set equal to zero.

A loop including steps 436, 444, 452, 460, 468, 476 and 484 may be used in a similar manner for other applicable constraints such as a maximum allowed via count or maximum adjacency length. Multiple loops are used as required by the complexity of the routing application.

Once the rerouted connection is checked against all constraints as described above, at step 492, it is determined whether all of the connections have been considered for reroute in this pass. If such is not the case, it will be necessary to return to step 348 and select a connection not previously considered and reroute that connection according to the above-described method. If all connections have been considered, then the next step 500 is to calculate the diagnostics and generate data for the rerouted connection. For example, this includes the connection length in each direction in each plane, the number of vias used, the number of overloaded nodes, and a measure of crosstalk performance. Also at step 500 data is generated corresponding to the coordinates of the rerouted connection paths. At step 508 it is determined whether to exit the detailed router because the total number of passes is sufficient, or perform another pass by returning to step 324. If no further passes are required, the process stops at step 516.

There are several useful strategies for choosing the costs for each pass. One strategy is to gradually increase the overloaded-node cost (OVER) in relation to the wire-length costs (Wx, Wy), as one proceeds from early to later iterative passes. In some instances, it is also useful to relax or decrease the overload penalty suddenly after it has reached a large value, then begin to increase it again gradually. Heuristically stated, the wires have "settled into" a good, but not fully legal, configuration. Decreasing the overload penalty makes the wires more "transparent" and frees nets to explore new routes that may be shorter and ultimately more nearly legal. This strategy applies more generally to the relationship between one or more costs pertaining to conditions that are "illegal" or relatively undesirable [COST ILLEGAL] and one or more costs pertaining to conditions that are relatively less undesirable [COST LEGAL]. It can be beneficial to first increase the value of the ratio COST ILLEGAL/COST LEGAL, then decrease it, then increase it again.

In multi-plane wiring problems, one can produce a more efficient utilization of wiring capacity in some cases by originally using fewer than the allowed number of wire planes in the early iterative passes. The plane(s) withheld are then "opened up" in subsequent passes. This can be easily accomplished by setting the wire-length cost to be initially large in the withheld planes, then gradually reducing that cost.

If the available vias are in fixed locations with wide "streets" that contain no via sites, it may be desirable to route wires preferentially in these streets and away from the vicinity of the via sites, unless the optimal path makes use of vias. In order to do this, wire-length costs that are smaller for paths lying in the streets than elsewhere are used.

It may be easier, especially for manual embedding, to reroute one wire to avoid crossing another within a plane, than it is to reroute a wire that is illegally sharing a fixed via site with another wire. To discourage multiple occupancy of fixed vias, one can impose a "via overload cost" that is greater than the overload cost for nodes that are not via sites. In addition, one should impose a via usage cost even when occupancy is legal, to discourage use of valuable vias.

In the prior art it is conventional to assign some wiring planes to carry predominantly wiring in the "x" direction, and the other planes to carry predominantly wiring in the "y" direction. One reason this is done is to insure that, in a sequential routing process (in which connections are either routed legally in some sequence or are set aside as unrouted until a later stage of the process), later-routed connections are able to be routed without being blocked by previously-routed paths occupying both x and y direction grid lines in all planes of the interconnection package. According to the present invention, all connections are routed initially without regard to whether some paths cross others in the same plane. There are no "early" or "later-routed" connections in the sense used above. The present invention accordingly provides a way of efficiently and successfully routing connections in "directionally uncommitted planes"; that is, using wiring planes for which no preferred wiring direction need be specified. (To specify that a plane should carry predominantly "x" direction wiring, one sets Wx less than Wy for that plane. Conversely, to leave the plane directionally uncommitted, one sets Wx and Wy equal for the plane.) This removes the need for such a preferred wiring direction constraint, and gives added capability for reducing the number of vias required, reducing the number of wiring planes required, and making better use of partially blocked wiring planes (e.g., when macro blockages on a chip occupy part of one or more wiring planes).

While the present invention has been described in connection with wiring on a rectangular grid, it has utility with other wiring schemes. In particular, diagonal wiring can readily be treated by the present invention. Within the maze-routing step (of the Lee type, for example) the grid points explored starting from a given grid point are its neighbors in the x,y and z directions for orthogonal routing and also its diagonal neighbors in the x-y plane for diagonal routing. The present invention can thus be used to generate directionally unconstrained eight-way wire routings in several planes simultaneously.

Consider a net comprising three pins, labeled A, B, C. If it is specified that the net consists of two connections (for example A-to-B and B-to-C), then the connections can be routed according to the method already described. The connection listing input would contain entries specifying that A and B are to be connected, and that B and C are to be connected. In some cases, it is allowed and desirable to join the three pins by generating a path from A to B, then generating a path from C to any point on the path A-to-B, or to any point on the path A-to-B that lies within a given region (for example, a given global cell). A node of the grid, other than a pin, at which two or more paths of the same net meet, is called a "T" node. A path may, in general, join two pins, or a pin and a "T" node, or two "T" nodes. Instead of specifying a connection listing as input, one now specifies a "job" listing. A job is defined to be any of the following: (i) a pair of pins, (ii) a pin and a path (or specified portion of a path), (iii) two paths (or specified portions of paths) belonging to the same net. For the present example, the job listing would include entries specifying that: (a) pins A and B are to be connected; and (b) pin C is to be connected to the path joining A to B. If a particular portion of the path A-to-B is to be specified, this restriction is to be included in entry (b). A "job priority list" is also to be provided as input, specifying for this example that job (a) is to be performed (at each iterative pass) prior to job (b).

This more general type of path routing can be accomplished using the present invention as follows. Input to the global or detailed router includes the board model specification, other information as hereinabove specified, and (instead of a connection listing) a job listing and a job priority list as described above. The method proceeds to route, examine, and iteratively reroute jobs according to the same procedure as was described for connections, using a mazerouter algorithm (for example of the Lee type), except that jobs of the same net are to be treated in the order specified in the job priority list, and there is no initial "L" shape path generation step. (It is well known in the art that the Lee type mazerouter can be utilized to generate a path of lowest cost between two specified regions, where each region may contain one or more nodes.)

The following results were obtained for a typical card wire routing test case involving 150 connections (mean connection length 12.5 grid units) on a 50-by-50 grid unit grid with two planes. With x and y wiring restricted to distinct planes, the connections were wired (with one connection overflow) using 250 vias and with wire length 4% over minimum possible length (i.e., the length if no wire paths had to make detours). When no directional restriction or preference was assigned to the two planes, all of the nets were wired with 48 vias and wire length 1.3% over minimum possible net length. Thus a factor-of five reduction in vias was realized.

The method has been applied to a printed circuit board wiring problem in which the number and locations of vias was several restricted (860 fixed vias available for wiring 1612 connections). A prior art wiring method yielded 148 overflow connections (using 3 x and 3 y wiring planes). An overflow connection is one that must be routed manually in its entirety. The present method yielded 25 crossing wires, and no overflows. A crossing wire is one that is illegal in that it crosses another wire in the same wiring plane. It needs to be re-routed manually only in the vicinity of the crossing. No directional preference was assigned by the user to the plane, nor to any region of a plane.

The resulting crossing wires were found to be very easily correctable by human intervention, in contrast with the overflows yielded by the usual wiring system: manual embedding time was estimated to be a total of a few hours for the 25 crossing wires, compared with three weeks for the 148 overflows yielded by the prior art wiring method.

The present wiring method is also useful for chip wiring in the presence of macro blockages. In a small test case improved wireability was achieved using directionally uncommitted planes, compared with that yielded by the same wiring codes when constrained by the conventional 'x' and 'y' plane restriction.

Sixty-five connections (mean length 75 grid units) were placed on a 100-by-100 grid unit grid containing approximately 50% blockage in plane 1 and no blockage in plane 2. They were wired with no overflows, 169 vias, and a wire length of 3% over a minimum possible length. With conventional wiring, even a smaller problem with 40 connections could not be satisfactorily wired (there were 8 overflows), because the x-direction track capacity (in plane 1) was so severely limited by the blockages.

The present method does not contain any bias against the imposition of directional constraints, either for entire planes or regions of planes. The point is rather that the method works without requiring such constraints, and consequently can yield better use of wiring space and/or a smaller via count, depending upon the application.

Finally, it is noted that although the use of the present invention permits wiring in directionally uncommitted planes, the algorithms described herein represent an improvement over prior art routing methods even when x and y directional preferences are specified. The invention can also accommodate the specification of unequal Wx and Wy costs in each plane for the early passes, followed by setting them substantially equal in subsequent passages in order to eliminate residual crossings or other illegalities by using "wrong-way wiring" (i.e., "x" wiring in the predominantly "y" plane, and vice versa).

Although the invention has been described and shown in terms of preferred embodiments thereof, it will be understood by those skilled in the art that the changes in form and details may be made therein without departing from the spirit and scope of the invention.

Having described the invention in terms of a preferred embodiment, I claim:

1. A method of establishing a plurality of connections, using global routing techniques on a data processing machine, each connection joining two pins using links arranged between nodes in a rectangular grid having X and Y coordinates in one or more planes labelled by a Z coordinate, wherein said connections are formed substantially from I, L, Z and U-shaped paths comprising the steps of:
    (a) inputting information to said data processing machine pertaining to grid specifications and connection listings;
    (b) randomly assigning an initial path for each connection on said grid using a randomly oriented substantially L-shaped path, unless said pins lie along the same X or Y coordinate in which case an I-shaped path is used, and randomly assigning each of said initial paths to one of said one or more planes;
    (c) beginning a pass through said connections by defining a penalty function in terms of specified costs;
    (d) selecting one of said connections which has not been considered previously during this pass through said connections which pass was initiated in step c) and removing from said grid the path assigned to said selected connection;
    (e) calculating said penalty function for each of the substantially I, L, Z, and U-shaped paths which joins the two pins of said selected connection and whose length does not exceed a specified value;

(f) selecting one of said paths based on the value of said penalty function;

(g) assigning said selected path to said selected connection;

(h) repeating steps (d) through (g) above until a desired number of connections have been routed thereby completing a pass;

(i) generating data describing X, Y and Z coordinates of the paths assigned to said routed connections;

(j) repeating steps (c) through (i) above until a desired number of passes have been completed; and (k) utilizing said data to establish said plurality of connections corresponding to said data.

2. The method of claim 1 wherein the step of selecting one of said paths is performed by selecting that path having a penalty function of smallest value.

3. The method of claim 1 wherein the step of defining a penalty function includes the following: a cost (WX) per link of path along the X coordinate; a cost (WY) per link of path along the Y coordinate; a cost (BEND) for each bend present in the path; and, a cost (CONG) for each unit by which the number of wires passing through a link (LOAD), exceeds some preselected fraction (THRESH), of the maximum number (CAPACITY) of paths allowed to pass through that link, each of said costs being a real number.

4. The method of claim 3 wherein the costs vary as a function of node location.

5. The method of claim 3 wherein the costs vary as a function of which connection is being routed.

6. The method of claim 1 wherein the step of ulilizing said data includes the step of generating artwork.

7. The method of claim 1 wherein the step of utilizing said data includes the step of controlling connection fabrication apparatus.

8. The method of claim 1 wherein said costs relate to path shape complexity and path position with respect to other paths and component on said grid.

9. A method of establishing a plurality of connections, using global routing techniques on a data processing machine, each connection joining two pins using links arranged between nodes in a rectangular grid having X and Y coordinates in one or more planes labelled by a Z coordinate, wherein said connections are formed from substantially I, L, Z and U-shaped paths comprising the steps of:

(a) inputting information to said data processing machine pertaining to grid specifications and connection listings;

(b) randomly assigning an initial path for each connection on said grid using a randomly oriented substantially L-shaped path, unless said pins lie along the same X or Y coordinate in which case an I-shaped path is used, and randomly assigning each of said initial paths to one of said one or more planes;

(c) beginning a pass through said connections by defining a penalty function in terms of specified costs;

(d) selecting one of said connections which has not been considered previously during this pass through said connections which pass was initiated in step (c) and removing from said grid the path assigned to said selected connection;

(e) calculating said penalty function for each of the substantially I, L, Z, and U-shaped paths which joins the two pins of said selected connection and whose length does not exceed a specified value;

(f) assigning a non-negative, numerical weight to each of said paths, the weight depending upon the value of the penalty function, and decreasing as the value of the penalty function increases;

(g) selecting a path from among said paths, with a probability proportional to said weight;

(h) assigning said selected path to said selected connection;

(i) repeating steps (d) through (h) above until a desired number of connections have been routed thereby completing a pass;

(j) generating data describing X, Y and Z coordinates of the paths assigned to said routed connections;

(k) repeating steps (c) through (j) above until a desired number of passes have been completed; and (l) utilizing said data to establish said plurality of connections corresponding to said data.

10. The method of claim 9 wherein the step of utilizing said data includes the step of generating artwork.

11. The method of claim 9 wherein the step of utilizing said data includes the step of controlling connection fabrication apparatus.

12. A method of establishing a plurality of connections, using global routing techniques on a data processing machine, each connection join two pins using links arranged between nodes in a rectangular grid having X and Y coordinates in one or more planes labelled by a Z coordinate, comprising the steps of:

(a) inputting information to said data processing machine pertaining to grid specifications and connection listings;

(b) randomly assigning an initial path for each connection on said grid using a randomly oriented substantially L-shaped path, unless said pins lie along the same X or Y coordinate in which case an I-shaped path is used, and randomly assigning each of said initial paths to one of said one or more planes;

(c) beginning a pass through said connections by defining a penalty function in terms of specified costs;

(d) selecting one of said connections which has not been considered previously during this pass through said connections which pass was initiated in step (c) and removing from said grid the path assigned to said connection;

(e) using a mazerouter procedure to calculate a path having a penalty function of smallest value, which joins the two pins of said selected connection;

(f) assigning said calculated path to said selected connection;

(g) repeating steps (d) through (f) above until a desired number of connections have been routed thereby completing a pass;

(h) generating data describing X, Y and Z coordinates of the paths assigned to said routed connections;

(i) repeating steps (c) through (h) above until a desired number of passes have been completed; and (j) utilizing said data to establish said plurality of connections corresponding to said data.

13. The method of claim 12 wherein the costs vary as a function of node location.

14. The method of claim 12 wherein the costs vary as a function of which connection is being routed.

15. The method of claim 12 wherein the step of utilizing said data includes the step of generating artwork.

16. The method of claim 12 wherein the step of utilizing said data includes the step of controlling connection fabrication apparatus.

17. The method of claim 12 wherein the mazerouter procedure at a given execution of step (e) comprises the following additional steps:
  (e)(1) calculating a lowest cost routing using one value of a penalty parameter;
  (e)(2) incrementing or decrementing the value of said penalty parameter to generate a new penalty parameter value if a property of the resulting routing has a value exceeding the upper limit of a user specified range of allowable values or is less than a minimum value of said user specified range, respectively;
  (e)(3) recalculating a lowest cost routing using said new penalty parameter value; and
  (e)(4) repeating the steps (e)(1) to (e)(3) a user specified number of times or until said property has a value within said user specified range, whichever occurs first.

18. A method of establishing a plurality of connections, using detailed routing techniques on a data processing machine, each connection joining two pins using links arranged between nodes in a rectangular grid having x and y coordinates in one or more planes labelled by a z coordinate, comprising the steps of:
  (a) inputting information to said data processing machine pertaining to grid model specifications, such as blockage and via locations, and connection listings;
  (b) randomly assigning an initial path for each connection on said grid using a randomly oriented substantially L-shaped path unless said pins lie along the same x or y coordinates in which an I-shaped path is used, and randomly assigning each of said initial paths to one of said one or more planes;
  (c) beginning a pass through said connections by defining a penalty function in terms of specified costs constituting non-negative numbers wherein said costs include: a cost (Wx) per link of path in a x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within user specified regions within one or more of said planes; a cost (ADJAC) for each link that the path uses, which link lies adjacent to another path within the same plane or adjacent planes;
  (d) selecting one of said connections which has not been considered previously during this pass through said connections which pass was initiated in step (c);
  (e) determining if said selected connection is to be rerouted;
  (f) removing from said grid the path assigned to said selected connection to be rerouted;
  (g) rerouting said selected connection using a mazerouter procedure to calculate a path having a penalty function of smallest value;
  (h) assigning said calculated path to said selected connection;
  (i) repeating steps (d) through (h) above until a desired number of connections have been selected thereby completing a pass;
  (j) generating data describing the x, y and z coordinates of the paths assigned to said routed connections; and
  (k) repeating steps (c) through (j) above until a desired number of passes have been completed; and
  (l) establishing said plurality of connections corresponding to said data.

19. The method of claim 18 wherein costs (Wx) and (Wy) vary as a function of link location on the grid.

20. The method of claim 18 wherein the cost (OVER) varies as a function of node location on the grid.

21. The method of claim 18 wherein the cost (OVER) varies as a function of the locations of other path crossings on the grid.

22. The method of claim 18 where one or more costs vary as a function of which connection is being routed.

23. The method of claim 18 wherein the costs (Wx) and (Wy) are chosen to be substantially equal to each other for one or more planes and for one or more passes.

24. The method of claim 18 wherein the step for defining each penalty function includes the further step of categorizing certain costs as (COST ILLEGAL) and certain other costs as (COST LEGAL) and varying the relative values of said costs such that the ratio (COST ILLEGAL)/(COST LEGAL) increases for a first series of passes, decreases for a next series of passes, and increases again for a final series of passes.

25. The method of claim 18 wherein the mazerouter procedure at a given execution of step (g) comprises the following additional steps:
  (g)(1) calculating a lowest cost routing using one value of a penalty parameter;
  (g)(2) incrementing or decrementing the value of said penalty parameter to generate a new penalty parameter value if a property of the resulting routing has a value exceeding the upper limit of a user specified range of allowable values or is less than a minimum value of said user specified range, respectively;
  (g)(3) recalculating a lowest cost routing using said new penalty parameter value; and
  (g)(4) repeating the steps (g)(1) to (g)(3) a user specified number of times or until said property has a value within said user specified range, whichever occurs first.

26. A method of establishing a plurality of connections, using detailed routing techniques on a data processing machine, each connection joining two pins using links arranged between nodes in a rectangular grid having x and y coordinates in one or more planes labelled by a z coordinate, comprising the steps of:
  (a) inputting information to said data processing machine pertaining to grid model specifications, such as blockage and via locations, connection listings and information related to one or more connections pertaining to a perimeter of a swath within which the connection preferentially is to be routed;
  (b) randomly assigning an initial path for each connection on said grid for which no perimeter informaton has been provided, using a randomly oriented substantially L-shaped path unless said pins lie along the same x or y coordinates in which an I-shaped path is used, and randomly assigning each of said initial paths to one of said one or more planes;

(c) beginning a pass through said connections by defining a penalty function in terms of specified costs constituting non-negative numbers wherein said costs include: a cost (Wx) per link of path in an x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within specified regions within one or more of said planes; a cost (ADJAC) for each link that the path uses, which link lies adjacent to another path within the same plane or adjacent planes; and a cost (BORDER) for each link that the path uses outside said perimeter;

(d) selecting one of said connections which has not been considered previously during this pass through said connections which pass was initiated in step (c);

(e) determining if said selected connection is to be routed during this pass;

(f) removing from said detailed grid, the path assigned to said selected connection to be routed if said connection has been previously routed;

(g) using a mazerouter procedure to calculate a path having a penalty function of smallest value, which joins the two pins of said selected connection;

(h) assigning said calculated path to said selected connection;

(i) repeating steps (d) through (h) above until a desired number of connections have been selected thereby completing this pass;

(j) generating data describing the x, y and z coordinates of the paths assigned to routed connections;

(k) repeating steps (c) through (j) above until a desired number of passes have been completed; and (l) utilizing said data to establish said plurality of connections using said data.

27. The method of claim 26 wherein the step of utilizing said data includes the step of generating artwork.

28. The method of claim 26 wherein the step of utilizing said data includes the step of controlling connection fabrication apparatus.

29. The method of claim 26 wherein the mazerouter procedure at a give execution of step (g) comprises the following additional steps:

(g)(1) calculating a lowest cost routing using one value of a penalty parameter;

(g)(2) incrementing or decrementing the value of said penalty parameter to generate a new penalty parameter value if a property of the resulting routing has a value exceeding the upper limit of a user specified range of allowable values or is less than a minimum value of said user specified range, respectively;

(g)(3) recalculating a lowest cost routing using said new penalty parameter value; and (g)(4) repeating steps (g)(1)–(g)(3) a user specified number of times or until said property has a value within said user specified range, whichever occurs first.

30. A method of establishing a plurality of routed jobs, using detailed routing techniques on a data processing machine, wherein each job is defined to be (i) a pair of pins, (ii) a pin and a path, or (iii) two paths; each job using links arranged between nodes in a rectangular grid having x and y coordinates in one or more planes labelled by a z coordinate, comprising the steps of:

(a) inputting information to said data processing machine pertaining to grid model specifications, such as blockage and via locations, and a job list and a job priority list which identifies a specific order for routing said jobs;

(b) beginning a pass through said jobs by defining a penalty function in terms of specified costs constituting non-negative numbers wherein said costs include: a cost (Wx) per link of path in an x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within user specified regions within one or more of said planes; a cost (ADJAC) for each link that the path uses, which link lies adjacent to another path within the same or adjacent planes;

(c) selecting one of said jobs which has not been considered previously during this pass, according to said job priority list;

(d) determining if said selected job is to be routed during this pass;

(e) removing from said grid the path assigned to said selected job to be routed, if said selected job has been routed previously;

(f) routing said selected job using a mazerouter procedure to calculate a path having a penalty function of smallest value;

(g) repeating steps (c) through (f) above until a desired number of jobs have been selected thereby completing this pass;

(h) generating data describing x, y, z coordinates of the paths assigned to said plurality of jobs;

(i) repeating steps (b) through (h) above until a desired number of passes have been completed; and (j) utilizing said data to establish said plurality of routed jobs corresponding to said data.

31. The method of claim 30 wherein the step of utilizing said data includes the step of generating artwork.

32. The method of claim 30 wherein the step of utilizing said data includes the step of controlling connection fabrication apparatus.

33. The method of claim 30 wherein the mazerouter procedure at a given execution of step (f) comprises the following additional steps:

(f)(1) calculating a lowest cost routing using one value of a penalty parameter;

(f)(2) incrementing or decrementing the value of said penalty parameter to generate a new penalty parameter value if a property of the resulting routing has a value exceeding the upper limit of a user specified range of allowable values or is less than a minimum value of said user specified range, respectively;

(f)(3) recalculating a lowest cost routing using said new penalty parameter value; and (f)(4) repeating steps (f)(1)–(f)(3) a user specified number of times or until said property has a value within said user specified range, whichever occurs first.

34. A method of establishing a plurality of connections, using global and detailed routing techniques on a data processing machine, each connection joining two pins, using a global grid comprising links arranged between nodes in a rectangular grid having X and Y coordinates in one or more planes labelled by a Z coordinate, and a detailed grid comprising links arranged between nodes in a rectangular grid having x and y coordinates in one or more planes labelled by a z coordinate, comprising the steps of:

(a) inputting information to said data processing machine pertaining to grid specifications and connection listings including global and detailed grid positions of said pins;

(b) randomly assigning an initial path for each connection on said global grid using a randomly oriented, substantially L-shaped path, unless said pins lie along the same X or Y coordinate in which case an I-shaped path is used, and randomly assigning each of said initial paths to one of said one or more planes;

(c) beginning a global routing pass through said connections by defining a penalty function in terms of specified costs wherein said costs are real numbers;

(d) selecting one of said connections which has not been considered previously during this global pass, and removing from said global grid the path assigned to said selected connection;

(e) calculating said penalty function for each substantially I, L, Z and U-shaped path which joins the two pins of said selected connection, and whose length does not exceed a specified value;

(f) selecting one of said paths based on the value of said penalty function;

(g) assigning said selected path to said selected connection;

(h) repeating steps (d) through (g) above until a desired number of connections have been rerouted thereby completing one global routing pass;

(i) generating data describing X, Y and Z coordinates of the paths assigned to said plurality of connections;

(j) repeating steps (c) through (i) above until a desired number of global passes have been completed;

(k) assuming, for each connection, a global swath comprising those global cells through which said connection has been globally routed;

(l) beginning a detailed routing pass through said connections by defining said penalty function in terms of specified costs wherein said costs are non-negative, real numbers;

(m) selecting one of said connections which has not been considered previously during this detailed routing pass;

(n) removing from said detailed grid, the path assigned to said connection to be routed selected in step (m), if said connection selected in step (m) has been routed previously on the detailed grid;

(o) routing said connection selected in step (m) using a mazerouter procedure to calculate a path having a penalty function of smallest value which joins the two pins of said connection selected in step (m) on said detailed grid;

(p) assigning said calculated path to said connection selected in step (m);

(q) repeating steps (m) through (p) above until a desired number of connections have been selected thereby completing a detailed routing pass;

(r) generating data describing x, y and z coordinates of the paths assigned to said plurality of connections; and (s) repeating steps (l) through (r) above until a desired number of detailed routing passes have been completed; and (t) utilizing said data to establish said plurality of connections corresponding to said data.

35. The method of claim 34 wherein the costs vary as a function of node location.

36. The method of claim 34 wherein the costs vary as a function of which connection is being routed.

37. The method of claim 34 wherein the mazerouter procedure at a given execution of step (o) comprises the following additional steps:

(o)(1) calculating a lowest cost routing using one value of a penalty parameter;

(o)(2) incrementing or decrementing the value of said penalty parameter to generate a new penalty parameter value if a property of the resulting routing has a value exceeding the upper limit of a user specified range of allowable value or is less than a minimum value of said user specified range, respectively;

(o)(3) recalculating a lowest cost routing using said new penalty parameter value; and (o)(4) repeating steps (o)(1)–(o)(3) a user specified number of times or until said property has a value within said user specified range, whichever occurs first.

38. A circuit board wherein a plurality of connections are formed between specified pins according to the method of establishing a plurality of connections, using detailed routing techniques on a data processing machine, each connection joining two pins using links arranged between nodes in a rectangular grid having x and y coordinates in one or more planes labelled by a z coordinate, said method comprising the steps of:

(a) inputting information to said data processing machine pertaining to grid model specifications, such as blockage and via locations, and connection listings;

(b) randomly assigning an initial path for each connection on said grid using a randomly oriented substantially L-shaped path unless said pins lie along the same x or y coordinates in which an I-shaped path is used, and randomly assigning each of said initial paths to one of said one or more planes;

(c) beginning a pass through said connections by defining a penalty function in terms of specified costs constituting non-negative numbers wherein said costs include: a cost (Wx) per link of path in a x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within user specified regions within one or more of said planes; a cost (ADJAC) for each link that the path uses, which link lies adjacent to another path within the same plane or adjacent planes;

(d) selecting one of said connections which has not been considered previously during this pass through said connections begun in step (c);

(e) determining if said selected connections is to be rerouted;

(f) removing from said grid the path assigned to said selected connection to be rerouted;

(g) rerouting said selected connection using a mazerouter procedure to calculate a path having a penalty function of smallest value;

(h) assigning said calculated path to said selected connection;

(i) repeating steps (d) through (h) above until a desired number of connections have been selected thereby completing a pass;

(j) generating data describing the x, y and z coordinates of the paths assigned to said routed connections; and (k) repeating steps (c) through (j) above until a desired number of passes have been completed;

(l) establishing said plurality of connections corresponding to said data.

39. A circuit board wherein a plurality of connections are formed between specified pins according to the method of establishing a plurality of connections, using detailed routing techniques on a data processing machine, each connection joining two pins using links arranged between nodes in a rectangular grid having x and y coordinates in one or more planes labelled by a z coordinate, said method comprising the steps of:

(a) inputting information to said data processing machine pertaining to grid model specifications, such as blockage and via locations, and connection listings and information related to one or more connections pertaining to a perimeter of a swath within which the connection preferentially is to be routed;

(b) randomly assigning an initial path for each connection on said grid for which no perimeter information has been provided, using a randomly oriented substantially L-shaped path unless said pins lie along the same x or y coordinates in which an I-shaped path is used, and randomly assigning each of said initial paths to one of said one or more planes;

(c) beginning a pass through said connections by defining a penalty function in terms of specified costs constituting non-negative numbers wherein said costs include: a cost (Wx) per link of path in a x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within user specified regions within one or more of said planes; a cost (ADJAC) for each link that the path uses, which link lies adjacent to another path within the same plane or adjacent planes; and a cost (BORDER) for each link that the path uses outside said perimeter;

(d) selecting one of said connections which has not been considered previously during this pass through said connections which pass was initiated in step (c);

(e) determining if said selected connection is to be routed during this pass;

(f) removing from said grid, the path assigned to said selected connection to be routed if said connection has been previously routed;

(g) using a mazerouter procedure to calculate a path having a penalty function of smallest value, which joins the two pins of said selected connection;

(h) assigning said calculated path to said selected connection;

(i) repeating steps (d) through (h) above until a desired number of connections have been selected thereby completing this pass;

(j) generating data describing the x, y and z coordinates of the paths assigned to said routed connections;

(k) repeating steps (c) through (j) above until a desired number of passes have been completed; and (l) utilizing said data to establish said plurality of connections using said data.

40. A circuit board wherein a plurality of connections are formed between specified pins according to the method of establishing a plurality of routed jobs, using detailed routing techniques on a data processing machine, wherein each job is defined to be (i) a pair of pins, (ii) a pin and a path, or (iii) two paths; each routed job using links arranged between nodes in a rectangular grid having x and y coordinates in one or more planes labelled by a z coordinate, said method comprising the steps of:

(a) inputting information to said data processing machine pertaining to grid model specifications, such as blockage and via locations, and a job list and a job priority list which identifies a specific order for routing said jobs;

(b) beginning a pass through said jobs by defining a penalty function in terms of specified costs constituting non-negative numbers wherein said costs include: a cost (Wx) per link of path in a x direction; a cost (Wy) per link of path in a y direction; a cost (OVER) for using a node already used by another path or occupied by a blockage; a cost (BEND) for each path bend; a cost (VIA) for each via used; a cost (VIAOVER) for using a via already occupied by another path; a cost (REGION) for each link that the path uses within specified regions within user one or more of said planes; a cost (ADJAC) for each link that the path uses, which link lies adjacent to another path within the same or adjacent planes;

(c) selecting one of said jobs which has not been considered previously during this pass, according to said job priority list;

(d) determining if said selected job is to be routed during this pass;

(e) removing from said grid the path assigned to said selected job to be routed, if said selected job has been routed previously;

(f) routing said selected job using a mazerouter procedure to calculate a path having a penalty function of smallest value;

(g) repeating steps (c) through (f) above until a desired number of jobs have been selected thereby completing this pass;

(h) generating data describing the x, y and z coordinates of the paths assigned to said plurality of jobs;

(i) repeating steps (b) through (h) above until a desired number of passes have been completed; and (j) utilizing said data to establishing said plurality of routed jobs corresponding to said data.

41. A circuit board wherein a plurality of connections are formed between specified pins according to the method of establishing a plurality of connections, using global and detailed routing techniques on a data processing machine, each connection joining two pins, using a global grid comprising links arranged between nodes in a rectangular grid having X and Y coordinates in one or more planes labelled by a Z coordinate, and a detailed grid comprising links arranged between nodes in a rectangular grid having x and y coordinates in one or more planes labelled by a z coordinate, comprising the steps of:

(a) inputting information to said data processing machine pertaining to grid model specifications and connection listings including global and detailed grid positions of said pins;

(b) randomly assigning an initial path for each connection on said global grid using a randomly oriented, substantially L-shaped path, unless said pins lie along the same X or Y coordinates in which case an I-shaped path is used, and randomly assigning each of said initial paths to one of said one or more planes;

(c) beginning a global routing pass through said connections by defining a penalty function in terms of specified costs wherein said costs are real numbers;

(d) selecting one of said connections which has not been considered previously during this global pass, and removing from said global grid the path assigned to said selected connection;

(e) calculating said penalty function for each substantially I, L, Z and U-shaped path which joins the two pins of said selected connection, and whose length does not exceed a specified value;

(f) selecting one of said paths based on the value of said penalty function;

(g) assigning said selected path to said selected connection;

(h) repeating steps (d) through (g) above until a desired number of connections have been rerouted thereby completing one global routing pass;

(i) generating data describing X, Y and Z coordinates of the paths assigned to said plurality of connections;

(j) repeating steps (c) through (i) above until a desired number of global routing passes have been completed;

(k) assuming, for each connection, a global swath comprising those global cells through which said connection has been globally routed;

(l) beginning a detailed routing pass through said connections by defining said penalty function in terms of specified costs wherein said costs are non-negative, real numbers;

(m) selecting one of said connections which has not been considered previously during this detailed routing pass;

(n) removing from said detailed grid, the path assigned to said connection to be routed selected in step (m), if said connection selected in step (m) has been routed previously on the detailed grid;

(o) routing said removed connection selected in step (m) using a mazerouter procedure to calculate a path having a penalty function of smallest value which joins the two pins of said connection selected in step (m) on said detailed grid;

(p) assigning said calculated path to said connection selected in step (m);

(g) repeating steps (m) through (p) above until a desired number of connections have been selected thereby completing a detailed routing pass;

(r) generating data describing x, y and z coordinates of the paths assigned to said plurality of connections; and (s) repeating steps (1) through (r) above until a desired number of detailed routing passes have been completed; and (t) utilizing said data to establish said plurality of connections corresponding to said data.

* * * * *